United States Patent
Kim et al.

(10) Patent No.: US 8,854,912 B2
(45) Date of Patent: *Oct. 7, 2014

(54) SEMICONDUCTOR MODULE INCLUDING MODULE CONTROL CIRCUIT AND METHOD FOR CONTROLLING THE SAME

(71) Applicant: SK hynix Inc., Icheon-si (KR)

(72) Inventors: Ki Han Kim, Uijeongbu-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 23 days.

This patent is subject to a terminal disclaimer.

(21) Appl. No.: 13/738,492

(22) Filed: Jan. 10, 2013

(65) Prior Publication Data

US 2014/0028361 A1  Jan. 30, 2014

Related U.S. Application Data

(63) Continuation of application No. 12/981,815, filed on Dec. 30, 2010, now Pat. No. 8,369,179.

(30) Foreign Application Priority Data

Mar. 30, 2010 (KR) .................. 10-2010-0028717

(51) Int. Cl.
G11C 8/00 (2006.01)
G11C 5/02 (2006.01)
H03K 3/02 (2006.01)

(52) U.S. Cl.
CPC ... *H03K 3/02* (2013.01); *G11C 5/02* (2013.01)
USPC .................. 365/230.03; 365/230.08

(58) Field of Classification Search
CPC ........................................... G11C 5/02
USPC ............... 365/230.03, 230.08, 230.02
See application file for complete search history.

(56) References Cited

U.S. PATENT DOCUMENTS

2001/0019503 A1 * 9/2001 Ooishi .................. 365/191

* cited by examiner

*Primary Examiner* — Vu Le
(74) *Attorney, Agent, or Firm* — William Park & Associates Patent Ltd.

(57) ABSTRACT

A module control circuit includes an input unit configured to receive a plurality of data signals from a plurality of data input/output pins and output an identification signal and an internal command signal. A latch unit is configured to latch the identification signal in accordance with a first enable signal to output a first group identification signal, latch the identification signal in accordance with a second enable signal to output a second group identification signal, and latch the internal command signal in accordance with the second enable signal to output a group command signal. A comparator is configured to compare the first group identification signal with the second group identification signal, and generate a selection signal. A multiplexer is configured to select one of the group command signal and a module command signal as an input command in response to the selection signal.

7 Claims, 5 Drawing Sheets

|      | DQ1 | DQ2 | DQ3 | DQ4 | DQ5 | DQ6 | DQ7 | DQ8 |
|------|-----|-----|-----|-----|-----|-----|-----|-----|
| EN1 'H' | L | L | L | L | X | X | X | X |
| EN2 'H' | L | L | L | L | L | L | L | L |

|      | DQ1 | DQ2 | DQ3 | DQ4 | DQ5 | DQ6 | DQ7 | DQ8 |
|------|-----|-----|-----|-----|-----|-----|-----|-----|
| EN1 'H' | L | L | L | L | X | X | X | X |
| EN2 'H' | L | L | H | L | L | L | H | H |

SEMICONDUCTOR MODULE INCLUDING MODULE CONTROL CIRCUIT AND METHOD FOR CONTROLLING THE SAME

CROSS-REFERENCES TO RELATED APPLICATIONS

The present application claims priority under 35 U.S.C 119(a) to Korean Application No. 10-2010-0028717, filed on Mar. 30, 2010, in the Korean intellectual property Office, which is incorporated herein by reference in its entirety set forth in full.

BACKGROUND

In general, a module is a constituent unit of machines or electronic devices having individually known characteristics and is a part group as an attachable/detachable function unit. In particular, a module in terms of hardware is constituted as a part of a device, equipment, or apparatus, and is an assembly in which components of the device, equipment, or apparatus are mutually coupled together. A module may be replaced with another spare part and may test functions.

A semiconductor memory device may include a plurality of semiconductor modules which perform various operations, such as a read operation, a write operation, and a refresh operation. A semiconductor module currently used is fabricated in a structure that includes a plurality of dynamic random access memory (DRAM)s in order for high integration and high operating speed.

FIG. 1 illustrates a configuration of a conventional semiconductor module.

As Illustrated in FIG. 1, the conventional semiconductor module includes a plurality of DRAMs, a command pin CMD_PIN through which a command signal CMD is inputted, a plurality of data input/output pins DQ_PIN through which data are inputted/outputted, and a command decoder configured to decoding the command signal CMD and generate an Input command CMD_IN. All the DRAMs included in the semiconductor module perform the same function at the same time according to the input command CMD_IN generated from the command decoder.

In the conventional module, even when all the DRAMs included in the semiconductor module are not needed, all the DRAMs included in the semiconductor module are operated together according to the input command CMD_IN, and as a result use of the conventional module results in unnecessary current consumption.

SUMMARY

An embodiment of the present invention relates to a module control circuit which is capable of reducing unnecessary current consumption by controlling a plurality of DRAMs included in a semiconductor module individually or on a group basis.

In an embodiment, a module control circuit includes: an input unit configured to receive a plurality of data signals from a plurality of data input/output pins and output an identification signal and an internal command signal; a latch unit configured to latches the identification signal in synchronization with a first enable signal to output a first group identification signal, and latch the identification signal and the internal command signal in synchronization with a second enable signal to output a second group identification signal and a group command signal; a comparator configured to compare the first group identification signal with the second group identification signal, and generate a selection signal; and a multiplexer configured to select one of the group command signal and a module command signal as an input command in response to the selection signal.

In an embodiment, a semiconductor module includes: a module control circuit configured to latch an identification signal and an internal command signal, which are inputted through a plurality of data input/output pins, in synchronization with an enable signal to generate first and second group identification signal and a group command signal, and output one of the group command signal and the module command signal as an input command signal according to whether the first and second group identification signals are equal to each other; and a first DRAM configured to receive the input command and perform an operation of the input command.

In an embodiment, a method for controlling a semiconductor module includes: latching a first data signal inputted from a first data input/output pin at an enable timing of a first enable signal and outputting the latched first data signal as a first group identification signal; latching a first data signal inputted from a first data input/output pin at an enable timing of a second enable signal and outputting the latched first data signal as a second group identification signal, and latching a second data signal inputted from a second data input/output pin and outputting the latched second data signal as a group command signal; comparing the first group identification signal with the second group identification signal, and generating a selection signal; and selecting one of the group command signal and the module command signal in response to the selection signal, and outputting the selected signal as an input command.

In an embodiment, a method for controlling a semiconductor module includes: transferring a command signal for generating first and second enable signals and a module command signal from a memory control unit to a semiconductor module; transferring a first data signal from the memory control unit to the semiconductor module at an enable timing of the first enable signal; and transferring a second data signal from the memory control unit to the semiconductor module at an enable timing of the second enable signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to the accompanying drawings. However, the embodiments are for illustrative purposes only and are not intended to limit the scope of the invention.

Figure 1:
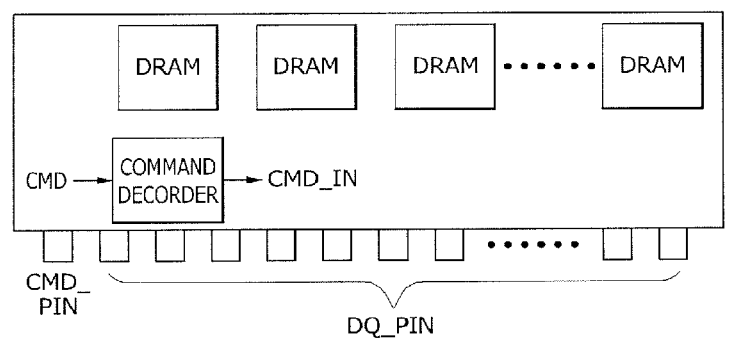
FIG. 1 shows a configuration of a conventional semiconductor module.
Figure 2:
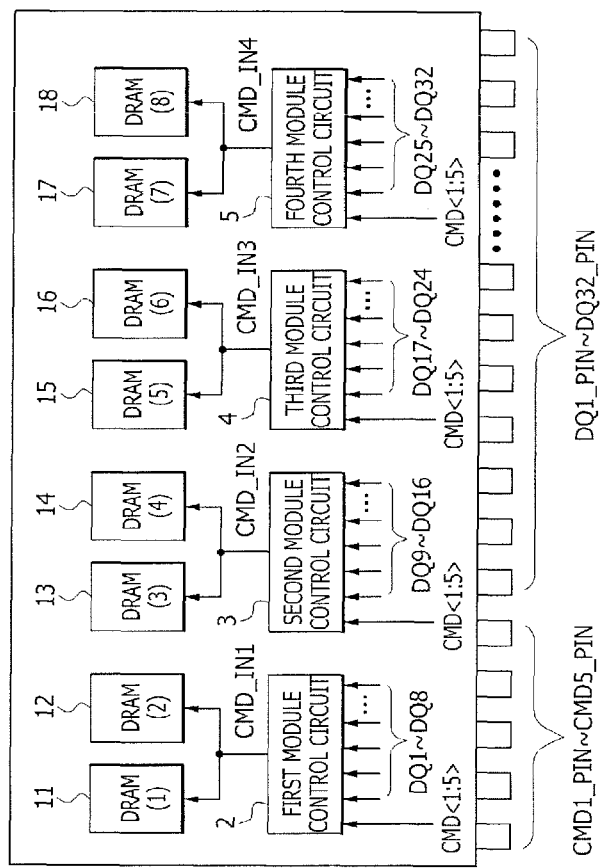
FIG. 2 shows a configuration of a semiconductor module according to an embodiment of the present invention.

FIG. 2 shows a configuration of a semiconductor module according to an embodiment of the present invention.

As shown in FIG. 2, the semiconductor module according to the embodiment of the present invention includes first to eighth DRAMs 11 to 18, a first module control circuit 2, a second module control circuit 3, a third module control circuit 4, and a fourth module control circuit 5. The first module control circuit 2 is configured to receive first to fifth command signals CMD<1:5> from first to fifth command pins CDM1_PIN to CMD5_PIN, receive first to eighth data signals DQ1 to DQ8 from first to eighth data input/output pins DQ1_PIN to DQ8_PIN, and generate a first input command CMD_IN1 for operating the first and second DRAMs 11 and 12. The second module control circuit 3 is configured to receive the first to fifth command signals CMD<1:5> from the first to fifth command pins CDM1_PIN to CMD5_PIN, receive ninth to sixteenth data signals DQ9 to DQ16 from ninth to sixteenth data input/output pins DQ9_PIN to DQ16_PIN, and generate a second input command CMD_IN2 for operating the third and fourth DRAMs 13 and 14. The third module control circuit 4 is configured to receive the first to fifth command signals CMD<1:5> from the first to fifth command pins CDM1_PIN to CMD5_PIN, receive seventeenth to twenty-fourth data signals DQ17 to DQ24 from to seventeenth to twenty-fourth data input/output pins DQ17_PIN to DQ24_PIN, and generate a third input command CMD_IN3 for operating the fifth and sixth DRAMs 15 and 16. The fourth module control circuit 5 is configured to receive the first to fifth command signals CMD<1:5> from the first to fifth command pins CDM1_PIN to CMD5_PIN, receive twenty-fifth to thirty-second data signals DQ25 to DQ32 from twenty-fifth to thirty-second data input/output pins DQ25_PIN to DQ32_PIN, and generate a fourth input command CMD_IN4 for operating the seventh and eighth DRAMs 17 and 18. Although not shown in detail, address signals may also be inputted through the first to fifth command pins CMD1_PIN to CMD5_PIN. For example, in the case of lower power DDR2 (LPDDR2), a command signal and an address signal are inputted through the same pin.

The configuration of the first module control circuit 2 will be described in more detail with reference to FIG. 3.

Figure 3:
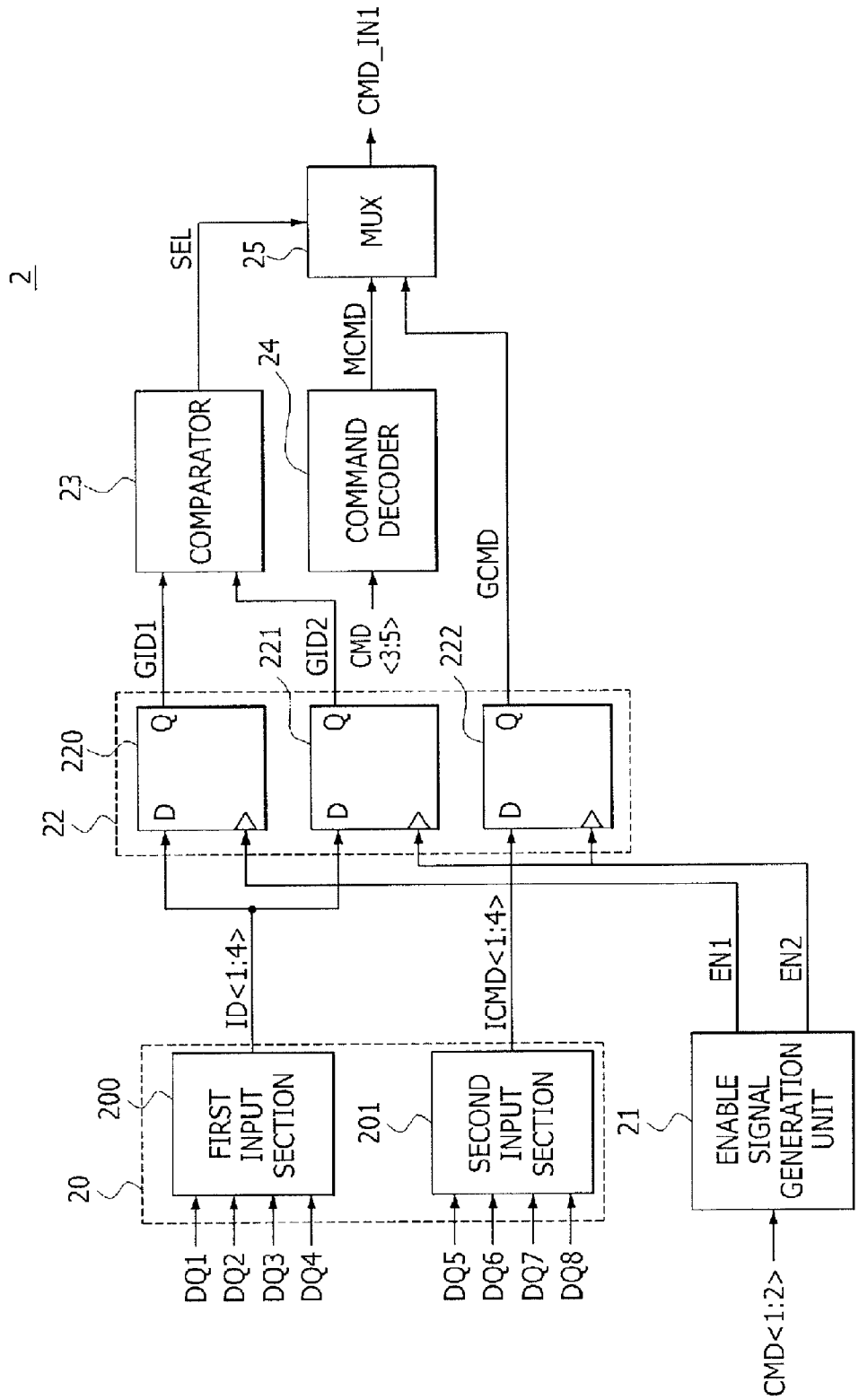
FIG. 3 shows a configuration of a first module control circuit included in the semiconductor module of FIG. 2.

As shown in FIG. 3, the first module control circuit 2 includes an input unit 20, an enable signal generation unit 21, a latch unit 22, a comparator 23, a command decoder 24, and a multiplexer 25.

The input unit 20 includes a first input section 200 and a second input section 201. Specifically, the first input section 200 is configured to receive the first to fourth data signals DQ1 to DQ4 from the first to fourth data input/output pins DQ1_PIN to DQ4_PIN, and output first to fourth identification signals ID<1:4>. The second input section 201 is configured to receive the fifth to eighth data signals DQ5 to DQ8 from the fifth to eighth data input/output pins DQ5_PIN to DQ8_PIN, and output first to fourth internal command signals ICMD<1:4>. The first input section 200 and the second input section 201 may be implemented with a typical data input buffer.

The enable signal generation unit 21 is configured to receive the first and second command signals CMD<1:2> from the first and second command pins CMD1_PIN and CMD2_PIN, decode the received first and second command signals CMD<1:2>, and generate a first enable signal EN1 and a second enable signal EN2 which are selectively enabled to according to the received first and second command signals CMD<1:2>. The enable signal generation unit 21 may be implemented with a typical command decoder. The combination of the first and second command signals CMD<1:2>, which enable the first enable signal EN1 and the second enable signal EN2, may be set in various ways according to embodiments. According to an embodiment, the second enable signal EN2 may be enabled to a logic high level at a timing later than the first enable signal EN1.

The latch unit 22 includes a first latch section 220, a second latch section 221, and a third latch section 222. The first latch section 220 is configured to transfer the first to fourth identification signals ID<1:4> as a first group identification signal GID1 when the first enable signal EN1 is enabled to a logic high level. The second latch section 221 is configured to transfer the first to fourth identification signals ID<1:4> as a second group identification signal GID2 when the second enable signal EN2 is enabled to a logic high level. The third latch section 222 is configured to transfer the first to fourth internal command signals ICMD<1:4> as a group command signal GCMD when the second enable signal EN2 is enabled to a logic high level. The first group identification signal GID1, the second group identification signal GID2, and the group command signal GCMD may be implemented with signals having various bit numbers. For example, according to an embodiment, the first group identification signal GID1, the second group identification signal GID2, and the group command signal GCMD may be implemented with 4-bit signals. Therefore, since the first latch section 220, the second latch section 221, and the third latch section 222 receive 4-bit signals and output 4-bit signal, the first latch section 220, the second latch section 221, and the third latch section 222 may be implemented with four D flip-flop circuits. The group command signal GCMD is a signal which allows only the first and second DRAMs 11 and 12 to equally operate among the first to eighth DRAMs 11 to 18 included in the semiconductor module.

The comparator 23 is configured to compare the first group identification signal GID1 with the second group identification signal GID2, generate a selection signal SEL of a logic high level when the first group identification signal GID1 and the second group identification signal GID2 are the same signal, and generate the selection signal of a logic low level when the first group identification signal GID1 and the second group identification signal GID2 are different signals. The comparator 23 may be easily implemented with a typical comparator which is capable of determining whether levels of the first group identification signal GID1 and the second group identification signal GID2 are equal to each other on a bit by bit basis.

The command decoder 24 is configured to receive the third to fifth command signals CMD<3:5> from the third to fifth command pins CMD3_PIN to CMD5_PIN, decode the received third to fifth command signals CMD<3:5>, and generate a module command signal MCMD. The command decoder 24 may be implemented using a typical command decoder. The module command signal MCMD is a signal which allows the first to eighth DRAMs 11 to 18 included in the semiconductor module to equally operate.

The multiplexer 25 is configured to output the group command signal GCMD as the first input command CMD_IN1 when the selection signal SEL is at a logic high level, and output the module command signal MCMD as the first input command CMD_IN1 when the selection signal SEL is at a logic low level.

The operation of the first module control circuit 2 configured as above will be described below with reference to FIGS. 4A and 4B.

Figures 4A, 4B, 5:
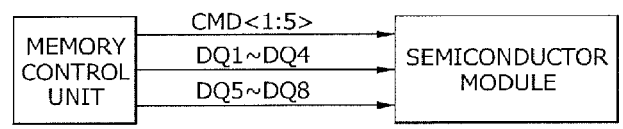
FIGS. 4A and 4B are tables shown for illustrating the operation of the first module control circuit of FIG. 3.
FIG. 5 is shown for illustrating a method for controlling the semiconductor module of FIG. 2.

First, a case in which the first to eighth data signals DQ1 to DQ8 are inputted as shown in FIG. 4A will be described.

As shown in FIG. 4A, if the first to fourth data signals DQ1 to DQ4 are inputted at levels of "L, L, L, L" when the first enable signal EN1 is enabled to a logic high level, the first latch section 220 latches and outputs the first group identification signal GID1 having a level of "L, L, L, L". In FIG. 4A, "L" represents a logic low level, "H" represents a logic high level, and "X" represents no relation to a logic level.

Next, as shown in FIG. 4A, if the first to fourth data signals DQ1 to DQ4 are inputted at levels of "L, L, L, L" when the second enable signal EN2 is enabled to a logic high level, the second latch section 221 latches and outputs the second group identification signal GID2 having a level of "L, L, L, L". Also, if the fifth to eighth data signals DQ5 to DQ8 are inputted at levels of "L, L, L, L" when the second enable signal EN2 is enabled to a logic high level, the third latch section 222 latches and outputs the group command signal GCMD having a level of "L, L, L, L".

Since the first group identification signal GID1 and the second group identification signal GID2 have the equal level of "L, L, L, L", that is, they are equal to each other, the comparator 23 generates the selection signal SEL having a logic high level.

The multiplexer 25 receives the selection signal SEL of the logic high level and outputs the group command signal GCMD having the level of "L, L, L, L" as the first Input command CMD_IN1. Therefore, the operations of the first and second DRAMs 11 and 12 receiving the first input command CMD_IN1 are controlled. For example, the active operation is performed in the first and second DRAMs 11 and 12 receiving the first input command CMD_IN1 having the level of "L, L, L, L". In an embodiment, the first and second DRAMs 11 and 12 are set to perform a self refresh operation when the first input command CMD_IN1 has the level of "L, L, L, H". The first and second DRAMs 11 and 12 are set perform a precharge powerdown operation when the first input command CMD_IN1 has the level of "L, L, H, L". The DRAMs 11 and 12 are set to perform an active power operation. When the first Input command CMD_IN1 has the level of "L, L, H, H". Such settings may be modified and adjusted through various according to embodiments.

Hereinafter, a case in which the first to eighth data signals DQ1 to DQ8 are inputted as shown in FIG. 48 will be described.

As shown in FIG. 4B, if the first to fourth data signals DQ1 to DQ4 are inputted at levels of "L, L, L, L" when the first enable signal EN1 is enabled to a logic high level, the first latch section 220 latches and output the first group identification signal GID1 having a level of "L, L, L, L, L".

Next, as illustrated in FIG. 4B, if the first to fourth data signals DQ1 to DQ4 are inputted at levels of "L, L, H, L" when the second enable signal EN2 is enabled to a logic high level, the second latch section 221 latches and output the second group identification signal GID2 having a level of "L, L, H, L". Also, if the fifth to eighth data signals DQ5 to DQ8 are inputted at levels of "L, L, H, H" when the second enable signal EN2 is enabled to a logic high level, the third latch section 222 latches and outputs the group command signal GCMD having a level of "L, L, H, H".

Since the first group identification signal GID1 having the level of "L, L, L, L" and the second group identification signal GID2 having the level of "L, L, H, L" are not equal to each other, the comparator 23 generates the selection signal SEL of a logic low level.

The multiplexer 25 receives the selection signal SEL of the logic low level and outputs the module command signal MCMD generated from the command decoder 24 as the first Input command CMD_IN1. Therefore, the first and second DRAMs 11 and 12 receiving the first input command CMD_IN1 are operated by the module command signal MCMD generated for equally operating the first to eighth DRAMs 11 to 18 included in the semiconductor module, regardless of the group command signal GCMD.

Since the second module control circuit 3, the third module control circuit 4, and the fourth module control circuit 5 have a configuration substantially identical to those of the first module control circuit 2, except the specific inputted/outputted signals, operation thereof is also substantially identical and therefore detailed description thereof will be omitted.

FIG. 5 is a configuration diagram of an integrated circuit including the semiconductor module of FIG. 2.

The integrated circuit shown in FIG. 5 includes a memory control unit which controls the semiconductor module. The memory control unit is configured to transfer first to fifth command signals CMD<1:5> for controlling the semiconductor module, and transfer the first to fourth data signals DQ1 to DQ4 and the fifth to eighth data signals DQ5 to DQ8 in order for the operation of the first module control circuit 2 shown in FIG. 3.

More specifically, the semiconductor module sequentially enables the first enable signal EN1 and the second enable signal EN2 by decoding the first and second command signals CMD<1:2> among the first to fifth command signals CMD<1:5> transferred from the memory control unit, and generates the module command signal MCMD by decoding the third to fifth command signals CMD<3:5> among the first to fifth command signals CMD<1:5>.

Subsequently, the semiconductor module receives the first to fourth data signals DQ1 to DQ4 from the memory control unit as the first to fourth identification signals ID<1:4> when the first enable signal EN1 is enabled to a logic high level, and generates the first group identification signal GID1.

Subsequently, the semiconductor module receives the first to fourth data signals DQ1 to DQ4 from the memory control unit as the first to fourth identification signals ID<1:4> when the second enable signal EN2 is enabled to a logic high level, and generates the second group identification signal GID2. Also, the semiconductor module receives the fifth to eighth data signals DQ5 to DQ8 as the first to fourth Internal command signals ICMD<1:4> and generates the group command signal GCMD.

Subsequently, the first group identification signal GID1 is compared with the second group identification signal GID2, and the semiconductor module outputs the group command signal GCMD as the first input command CMD_IN1 when the first group identification signal GID1 and the second group identification signal GID2 are equal to each other, and outputs the module command signal MCMD as the first input command CMD_IN1 when the first group identification signal GID1 and the second group identification signal GID2 are not equal to each other.

As described above, the semiconductor module according to an embodiment of the present invention may group some DRAMs among the plurality of DRAMs included in the semiconductor module by using the data input/output pins, and set the grouped DRAMs to perform the same operations on a group basis. Therefore, since the DRAMs which are not required to perform the operations among the DRAMs included in the semiconductor module are not operated, thereby reducing current consumption by eliminating unnecessary current consumption.

Figure 6:
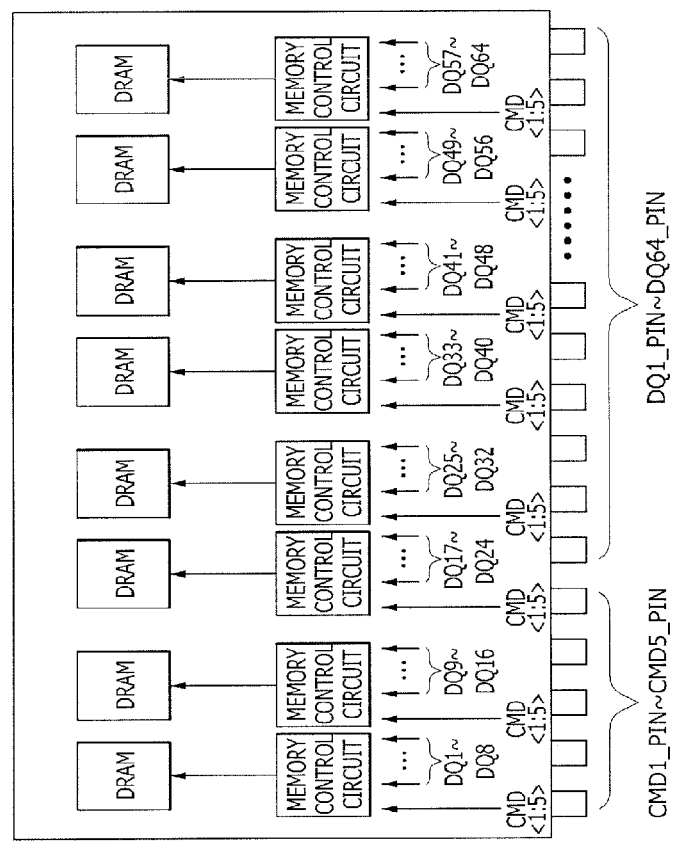
FIG. 6 shows a configuration of a semiconductor module according to an embodiment of the present invention.

In the semiconductor module according to an embodiment of the present invention, two DRAMs are grouped and the module control circuits which control the operations of the two DRAMs are provided. However, the number of the module control circuits may be variously changed according to embodiments. That is, like the configuration of the semiconductor module of FIG. 6 according to embodiments of the present invention, the semiconductor module may include eight module control circuits which control the operations of eight DRAMs.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A module control circuit comprising:
    a latch unit configured to latch an identification signal in accordance with a first enable signal to output a first group identification signal, to latch the identification signal in accordance with a second enable signal to output a second group identification signal, and to latch the internal command signal in accordance with the second enable signal to output a group command signal;
    a comparator configured to compare the first group identification signal with the second group identification signal, and to generate a selection signal; and
    a multiplexer configured to select one of the group command signal and a module command signal as an input command in response to the selection signal.

2. The module control circuit of claim 1, wherein the latch unit comprises:
    a first latch section configured to latch the identification signal at a time point corresponding to an enabling of the first enable signal, and output the first group identification signal;
    a second latch section configured to latch the identification signal at a time point corresponding to an enabling of the second enable signal, and to output the second group identification signal; and
    a third latch section configured to latch the internal command signal at the time point corresponding to the enabling of the second enable signal, and to output the group command signal.

3. The module control circuit of claim 1, wherein the selection signal has a first level when the first and second group identification signals are equal to each other, and the selection signal has a second level different from the first level when the first and second group identification signals are not equal to each other.

4. The module control circuit of claim 3, wherein the multiplexer selects and outputs the group command signal as the input command when the selection signal has the first level, and the multiplexer selects and outputs the module command signal as the input command when the selection signal has the second level.

5. The module control circuit of claim 1, further comprising an enable signal generation unit configured to generate the first enable signal and the second enable signals by decoding a command signal inputted from a command pin.

6. The module control circuit of claim 5, wherein the time point corresponding to the enabling of the second enable signal is after the time point corresponding to the enabling of the first enable signal.

7. The module control circuit of claim 1, further comprising a command decoder configured to generate the module command signal by decoding a command signal inputted from a command pin.

* * * * *